United States Patent [19]

Schade, Jr.

[11] 3,863,331

[45] Feb. 4, 1975

[54] MATCHING OF SEMICONDUCTOR DEVICE CHARACTERISTICS

[75] Inventor: Otto Heinrich Schade, Jr., North Caldwell, N.J.

[73] Assignee: RCA Corporation

[22] Filed: Sept. 11, 1972

[21] Appl. No.: 287,863

[52] U.S. Cl. ........................ 29/577, 29/578, 357/40, 357/46

[51] Int. Cl. ........................ B01j 17/00

[58] Field of Search ........ 29/577, 571, 578; 148/41, 148/42, 43; 96/41, 42, 43, 36.2, 38.3

[56] References Cited

UNITED STATES PATENTS

| | | | |
|---|---|---|---|
| 1,181,163 | 5/1916 | Pilkington | 96/41 |
| 2,499,100 | 2/1950 | Kessler | 95/5.1 |
| 3,566,518 | 3/1971 | Brown | 29/571 |
| 3,729,316 | 4/1973 | Castrucci | 96/38.3 |
| 3,747,200 | 7/1973 | Rutledge | 29/577 |

*Primary Examiner*—Granville Y. Custer, Jr.
*Assistant Examiner*—W. C. Tupman
*Attorney, Agent, or Firm*—H. Christoffersen; R. P. Williams

[57] ABSTRACT

Characteristics of photolithographically-defined planar semiconductor device pairs made from the same master are different, but many of the differences are regular in kind. To achieve a device pair in which the magnitude of the difference in the characteristics of the elements of the pair is reduced, two pairs are made from the same master. The first element of one pair is connected to the second element of the other pair so that the two operate as one composite element. The second element of the one pair is connected to the first element of the other, similarly for operation as another composite element the characteristics of which closely match those of the one composite element.

4 Claims, 8 Drawing Figures

MATCHING OF SEMICONDUCTOR DEVICE CHARACTERISTICS

BACKGROUND OF THE INVENTION

This invention relates to semiconductor devices and circuits. More particularly, the invention pertains to circuits which have at least two circuit paths, the characteristics of which should be substantially equal for optimum circuit performance.

Many circuits employ semiconductor devices in matched pairs. For example, differential amplifiers which include matched differential pairs of transistors are used in many semiconductor integrated circuit devices. See the handbook "RCA Linear Integrated Circuits", August 1970, Technical Series IC-42, page 37 et seq., available from RCA Corporation, Solid State Division, Somerville, N.J., 08876. In the differential amplifier configuration, two transistors are employed to compare two input signals, and the two transistors should have identical electrical characteristics for optimum circuit operation. It has been difficult, if not commercially impossible, to make devices with exactly the same characteristics, either as discrete devices or as devices which are part of an integrated circuit device.

The problem of matching semiconductor devices has been recognized. See, for example, Koepp, U.S. Pat. No. 3,349,300, issued Oct. 24, 1967 or Leistiko, Jr. et al. U.S. Pat. No. 3,183,128, issued May 11, 1965. In both of these patents, it is disclosed that close matching between devices may be expected if the devices are made at the same time, i.e. by the same processing, on the same semiconductor body. Even though some improvement in matching may be obtained by following these teachings, closer matches are desirable for many critical circuit applications.

THE DRAWINGS

DETAILED DESCRIPTION

The present invention is described herein as related to circuits which include MOS transistors. The principles of the invention are applicable as well, however, to semiconductor circuits which employ bipolar transistors, MOS transistors, resistors, capacitors, etc.

Figure 1:
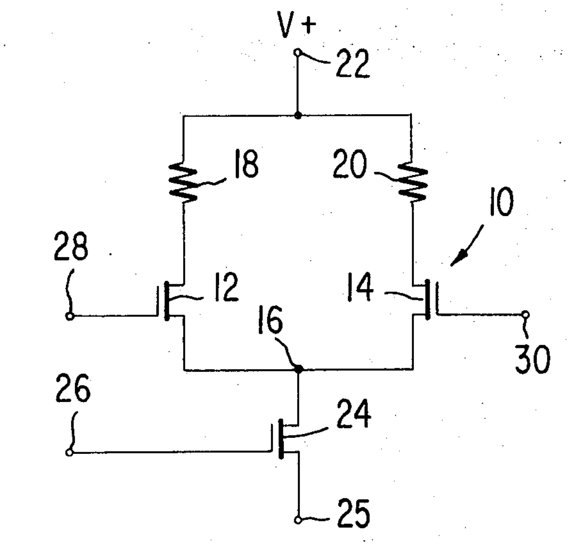
FIG. 1 (PRIOR ART)
FIG. 1 is a schematic diagram of an MOS differential amplifier circuit according to the prior art.

A circuit, namely a differential amplifier, of the kind to which the present invention may be applied is indicated at 10 in FIG. 1. This known circuit includes a pair of transistors 12 and 14 connected as a differential pair. The transistors 12 and 14 have their source terminals connected together at a node 16. The respective drain terminals of the transistors 12 and 14 are connected through resistors 18 and 20, respectively, to a source of potential represented by the terminal 22. A third transistor 24 is connected between the node 16 and another terminal 25. The gate of the transistor 24 is connected to a terminal 26. The gates of the transistors 12 and 14 are connected to terminals 28 and 30, respectively.

The operation of the circuit 10 is known. A source of working potential may be applied across the terminals 22 and 25. Input signals which are to be compared are applied to the terminals 28 and 30. A voltage is applied to the terminal 26 to bias the transistor 24 into the saturated portion of its transfer characteristic, so that it can act as a constant current sink. The sum of the currents through the transistors 12 and 14 will be equal to the total amount of current supplied to the transistor 24. If the transistors 12 and 14 are matched, i.e., if the two electrical circuit paths defined by the two transistors have substantially equal electrical characteristics, and if equal input signals are applied, the two transistors 12 and 14 will be balanced and one-half the total current will flow through each transistor. This condition presents the usual operating point for an analog differential amplifier.

Figure 2:
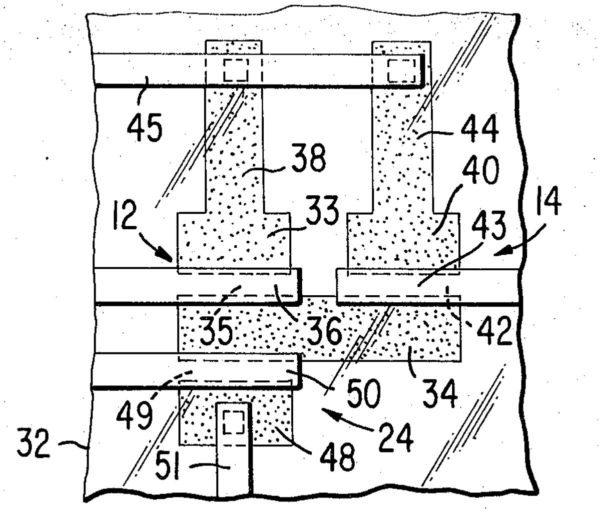
FIG. 2 (PRIOR ART)
FIG. 2 is a partial plan view of an integrated circuit layout of the circuit of FIG. 1.

FIG. 2 illustrates how the circuit 10 of FIG. 1 may be realized in integrated circuit form as a monolithic integrated circuit device 32, which may be conventionally made in a single monocrystalline semiconductor body by photolithographic masking and diffusion processes. The transistor 12 includes a diffused drain region 33 and a diffused, elongated source region 34. These regions define between them a channel 35 of controllable conductivity. Overlying the channel 35 is an insulated gate electrode 36 to which an input signal may be applied. The function of the resistor 18 may be realized in the device 32 by an elongated extension 38 of the drain region 33.

The transistor 14 is similarly constructed. It has a drain region 40, a source region constituted by a portion of the region 34, a channel region 42, and a gate electrode 43. An elongated extension 44 of the drain region 40 performs the function of the resistor 20. A conductor 45 is connected to the remote ends of the resistor regions 38 and 44. The two transistors 12 and 14 should be placed close together, as shown here and as taught by the art, to aid in keeping the differences between them small, as well as to conserve space for efficient use of the semiconductor material.

The transistor 24 is comprised of a drain region, which in this embodiment is the same region 34 as the source regions of the transistors 12 and 14, and a source region 48, spaced from the region 34 to define a channel region 49. A gate electrode 50 and a source connection 51 complete the structure of the transistor 24. The configuration of the transistors shown in FIG. 2 is exemplary only and many other configurations are possible. For example, the channel regions 35, 42, and 49 of the respective transistors need not be straight as shown but may have meandering shapes, depending upon the gain characteristics desired. Some other shapes for insulated gate field effect transistors are shown in Olmstead et al., U.S. Pat. No. 3,427,514, issued Feb. 11, 1969. See FIG. 3 of this patent, for example.

As stated above, it is desirable that the transistors 12 and 14 in the differential amplifier 10 be matched for optimum circuit operation. The prior art has recognized that a relatively close match may be expected if the two transistors are formed close to one another by the same processing on the same silicon chip. Differences remain, however, because among other things it is virtually impossible for a photomask designer to produce exactly equal structures in the photomasks used to define the transistors. As is known, the preparation of a photomask usually begins with a drawing of the photomask which may be made by a machine but is usually made by hand. It is seldom, if ever possible, for a draftsman or a drafting machine to draw exactly equal shapes.

I have discovered that even though two transistors in a pair are almost always different in some way, as between two pairs made by the same procedure from the same photolithographic master many of the differences between the two pairs are of the same kind or, in other words, these differences are ordered. For example, if for the same input signal one member of the pair transfers a larger current than the other, that characteristic will often be present in the other pair, although the absolute values of the currents may be different. Moreover, the ordered differences are proportional from pair to pair. There are also differences between the pairs which are not ordered, i.e., they are random. For example, random differences may be the result of differences in localized defect density in the crystal from which the devices are made. Ordered differences, on the other hand, may be the result, for example of differences as between the two pairs in the time of exposure during a photographic processing step. The present novel process applies to the correction of the ordered differences. The random differences are not believed to be subject to correction.

Figure 3:
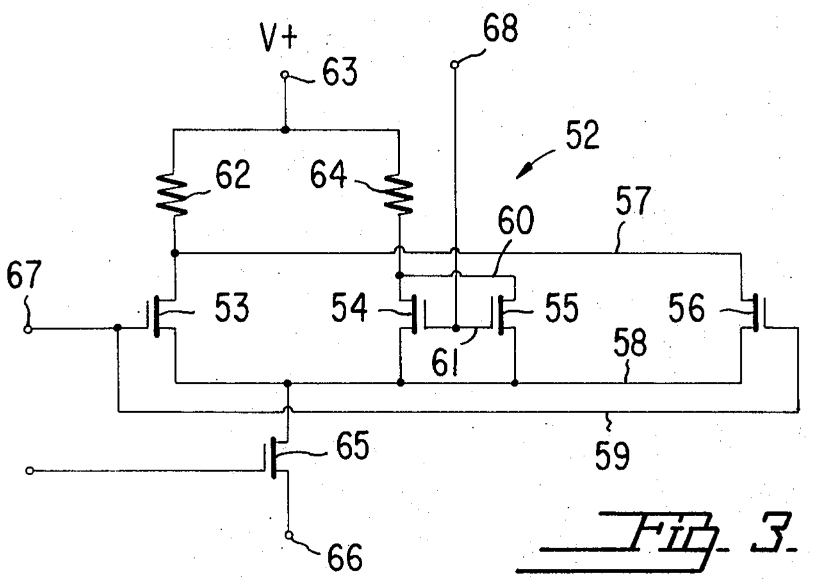
FIG. 3 is a schematic circuit diagram of the present novel circuit.

The improved circuit 52 shown in FIG. 3 is one embodiment of my discovery. The circuit 52 includes a first pair of transistors or subelements 53 and 54 respectively, and a second pair of transistors or subelements 55 and 56. Each pair may be on one common body of semiconductive material or they may be on two different bodies. However, the two pairs must be made from the same photolithographic master. In the circuit 52 the two transistor pairs are "cross-paralleled" so that the dominant transistor of one pair is connected to the non-dominant transistor of the other pair, and vice versa. Thus the first transistor 53 of the first pair is connected in parallel to the second transistor 56 of the second pair so that these two transistors act as a single composite device. A conductor 57 connects the drains of the transistors 53 and 56 together, a conductor 58 connects their sources together, and a conductor 59 connects their gates together. Similarly, the second transistor 54 of the first pair is connected in parallel with the first transistor 55 of the second pair by means of a drain connector 60, the source connector 58, and a gate connector 61, so that these latter two transistors operate as one composite unit.

The drains of the transistors 53 and 56 are connected through a resistor 62 to a source of potential represented by the terminal 63. The drains of the transistors 54 and 55 are similarly connected through a resistor 64 to the terminal 63. The sources of all the transistors are connected through a transistor 65 like the transistor 24 in the prior art circuit 10 to a terminal 66. Two input terminals are indicated at 67 and 68.

All the differences between the two transistors in a differential pair are collectively referred to by the term "offset." The circuit 52 will, as long as the two differential pairs therein are made from the same master, exhibit a substantially reduced offset as compared to the individual pairs alone. As an example, if it is assumed that the difference between individual members of each pair is in the transconductance of each, then if the transconductance of the transistor 53 is greater than that of the transistor 54, if follows from my discovery that the transconductance of the transistor 55 will be greater than that of the transistor 56. If the transconductances of the transistors 53 and 54 are related as 11:10 and the transconductances of the transistors 55 and 56 are related as 10:9.1, it will be seen that the values are proportional and ordered, even though different. The parallel connection of the transistor 53 to the transistor 56 will thus produce a composite device having a transconductance of 20.1 and the parallel connection of the transistors 54 and 55 will similarly produce a composite device having a transconductance of 20.0. Consequently, while in each individual pair the transconductance differs by about 10 percent, in the combined pairs it differs by only 0.5 percent.

Figure 4:
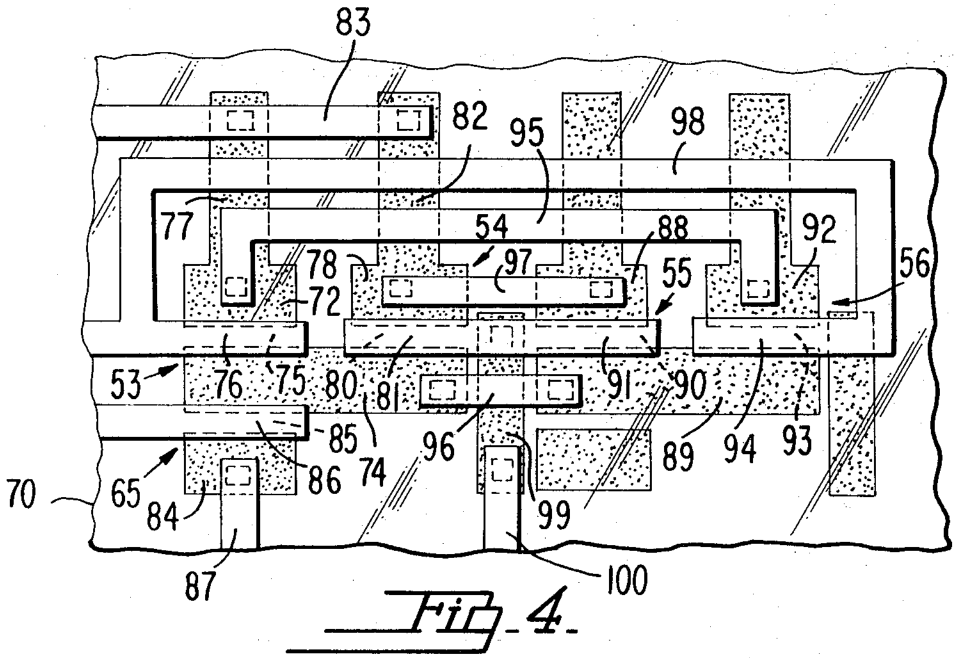
FIG. 4 is a partial plan view of an integrated circuit layout of the circuit of FIG. 3.

One example of an integrated circuit device 70 which provides all of the components of the circuit 52 is illustrated in FIG. 4. The individual elements of the device 70 are similar to those of the device 32.

The transistor 53 in the device 70 includes a diffused drain region 72 and a diffused elongated source region 74 which define between them a channel 75 of controllable conductivity. Overlying the channel 75 is an insulated gate electrode 76 to which an input signal may be applied. The function of the resistor 62 is realized in the device 70 by an elongated extension 77 of the drain region 72.

The transistor 54 is similarly constructed. It has a drain region 78, a source region constituted by a portion of the region 74, a channel region 80 and a gate electrode 81. An elongated extension 82 of the drain region 78 performs the function of the resistor 65 in the circuit of FIG. 3. A conductor 83 is connected to the remote ends of the resistor regions 77 and 82.

The transistor 65 is similar to the transistor 24 of FIG. 2 and includes a drain region which may be the same region 74 as the source regions of the transistors 53 and 54 and a source region 84 spaced from the region 74 to define a channel region 85. The transistor 65 also has a gate electrode 86 and a source connection 87.

Transistors 55 and 56 in the device 70 are, in the practice of this invention, formed from the same photomasks as the transistors 53 and 54 and, therefore, will have the same configuration. The transistor 55 has a drain region 88 and a source region 89, which is elongated like the region 74. These regions define the ends of a channel region 90, and a gate electrode 91, which may be an extension of the gate electrode 81 of the transistor 54, overlies the channel 90.

The transistor 56 has a drain region 92, a source region constituted by the elongated region 89, a channel 93, and a gate electrode 94.

Means are provided in the device 70 to connect the transistors in cross-parallel relationship in the manner described with respect to circuit 52. In particular, there is a conductor layer 95, which corresponds to the conductor 57 of FIG. 3, which serves to connect the drains of the transistors 53 and 56 together. A conductor layer 96, serves to connect all the sources together. A drain connector layer 97 interconnects the drains 78 and 88 of the transistors 54 and 55, respectively. A conductor layer 98 interconnects the gate electrode 76 of the transistor 53 and the gate electrode 94 of the transistor 56 to complete the parallel combination.

In the configuration shown in FIG. 4, a cross-over is necessary to permit connection to be made to the gate electrodes 81 and 91 of the transistors 54 and 55. This cross-over may be conventional and in this embodiment takes the form of a diffused region 99 which extends under the source connector layer 96. An input conductor layer 100 is connected to the region 99 at a location opposite from the connection of the gate electrodes 81 and 91. The device 70 is otherwise conventional and it will be understood by those or ordinary skill that wherever metal conductors overlie diffused regions a surface insulating coating is employed to isolate these components, and apertures are provided in this coating whereever contact between the metal layers and the semiconductor is desired. Such openings are not numbered in FIG. 4.

As previously stated the two pairs of transistors 53–54, 55–56 must be made from the same photolithographic master in order for the improved results of the present invention to occur. FIGS. 5, 6, 7, and 8 are provided to show one way to make a photomask useful for making the diffused regions of the device 70 to accomplish this end.

Figure 5:
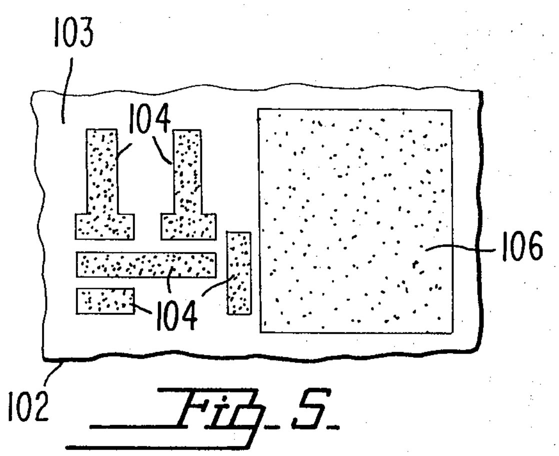
FIG. 5 is a partial plan view of a photographic master adapted to make a photomask for the layout of FIG. 4.

The first step in the fabrication of a suitable photomask is the designing of a master image and such a master is shown at 102 in FIG. 5. This master includes a first zone 103, shown to the left of FIG. 5, in which device definitive images constituted by opaque regions 104 are disposed. The master 102 has a second zone 106 of at least the same area as the first zone which second zone is entirely opaque and which is used for a purpose which will become apparent below.

Figure 6:
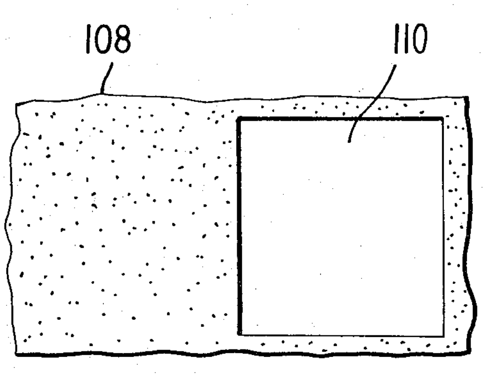
FIG. 6 is a partial plan view of an auxiliary photographic master adapted for use with the master of FIG. 5.

FIG. 6 illustrates an auxiliary mask 108 which is largely opaque but which includes a transparent portion 110 of about the same size as the opaque region 106 of the master 102.

Figure 7:
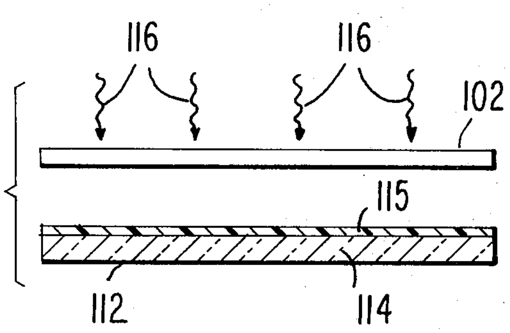
FIGS. 7 and 8 are diagrammatic illustrations of a process of making a photomask in accordance with the present novel process.
Figure 8:
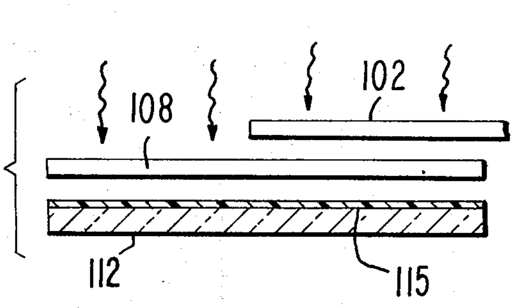

The use of the master 102 and the auxiliary mask 108 is as follows. As shown in FIG. 7, there is a photomask blank 112 which consists of a glass substrate 114 and a coating 115 of initially unexposed photo emulsion. The master is shown again at 102, disposed above the blank 112. An exposing light source is suggested by the arrows 116 in FIG. 7. When the emulsion 115 is exposed through the mask 102 portions thereof will be exposed to leave unexposed the areas corresponding to the master images 104 and a zone corresponding to the portion 106 of the master 102. Next, the auxiliary mask 108 is placed over the photomask blank 112 with the transparent portion 110 thereof in registery with the region corresponding to the portion 106 and with the opaque portions thereof overlying the previously exposed portions to prevent re-exposure thereof. The master 102 is offset to the right in FIG. 8 to bring the master images 104 into position over the transparent portion 110 of the auxiliary mask 108. A second exposure of the photomask blank through the master 102 and the auxiliary mask 108 will then expose those portions of the emulsion 115 which will later be used to form the regions of the other pair of transistors in the device 70. By this procedure, a single photomask representing two pairs of transistors is made in which both pairs are related to the same master; that is, the pattern on the photomask comprises two distinct patterns, each of which has properties determined by a single pattern on the master.

Since the same master is used to form both pairs of transistors, the relative images which are made therefrom should be of the same shape. It is seldom, if ever, possible, however, to make two exposures of exactly the same time duration or with exactly the same light intensity for example. Thus, there will be differences between the two exposures. However, as stated above, I have discovered that the differences are ordered. Consequently, the cross-parallel combination of these transistors pairs with their ordered differences in the manner which has been described herein will result in very close matching of the composite transistor pairs.

What is claimed is:

1. A method of making an electrical circuit which includes a pair of circuit elements having closely matched characteristics comprising:

forming, by photolithographic processes using at least one photomask, two pairs of subelements, each pair including a first subelement and a second subelement, said first subelements being made by using a pair of separate patterns on said photomask, each of said first pair of separate patterns on said photomask being made from a first pattern on a master, said second subelements being made by using a second pair of separate patterns on said photomask, each of said second pair of said separate patterns being made from a second pattern on said master, and connecting the first subelement of one pair with the second subelement of the other pair and the second subelement of said one pair with the first subelement of the other pair.

2. A method as defined in claim 1 wherein both said pairs of said subelements are formed by processes performed on one common body of semiconductive material.

3. A method as defined in claim 2 wherein said photomask is made by a process including the steps of, designing a master for said device including a first zone of predetermined area in which said first and second patterns are disposed and a second zone of at least the same predetermined area, said second zone being entirely opaque, and making a photomask from said master by making an exposure of a photosensitive means with said master, said second zone preventing exposure of a portion of said photosensitive means, protecting the exposed portions of said photosensitive means from re-exposure, repositioning said master to orient said first zone with respect to the unexposed portion of said photosensitive means, and making an exposure of said unexposed portion with said first zone of said master.

4. A method of making an electrical circuit which includes a pair of circuit elements having closely matched characteristics comprising:

forming a photolithographic master having a pair of like pattern arrangements thereon, forming a photomask from said master by a repetitive exposure thereof such that said photomask has at least two pairs of said pair of like pattern arrangements, exposing a photoresist coating on a semiconductor wafer with said photomask, said exposing step together with other steps making at least two pairs of subelements, each of said pair of subelements corresponding to the said pair of like pattern arrangements in said master and include a first subelement and a second subelement, and connecting the first subelement of one pair with the second subelement of the other pair to form one of said circuit elements and the second subelement of said one pair with the first subelement of the other pair to form the other of said circuit elements.

* * * * *

UNITED STATES PATENT OFFICE
CERTIFICATE OF CORRECTION

PATENT NO. : 3,863,331

DATED : February 4, 1975

INVENTOR(S) : Otto Heinrich Schade, Jr.

It is certified that error appears in the above-identified patent and that said Letters Patent are hereby corrected as shown below:

Column 6, line 24, after "a" insert --first--

Signed and sealed this 6th day of May 1975.

(SEAL)
Attest:

RUTH C. MASON
Attesting Officer

C. MARSHALL DANN
Commissioner of Patents and Trademarks